(12) United States Patent
Benvegnu (10) Patent No.: US 12,148,148 B2
(45) Date of Patent: Nov. 19, 2024

(54) THICKNESS MEASUREMENT OF SUBSTRATE USING COLOR METROLOGY (71) Applicant: Applied Materials, Inc., Santa Clara, CA (US)

(72) Inventor: Dominic J. Benvegnu, La Honda, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 18/198,053

(22) Filed: May 16, 2023

(65) Prior Publication Data

US 2023/0281801 A1 Sep. 7, 2023

Related U.S. Application Data (60) Continuation of application No. 17/242,158, filed on Apr. 27, 2021, now Pat. No. 11,682,114, which is a
(Continued)

(51) Int. Cl.
*G06T 7/00* (2017.01)
*B24B 37/013* (2012.01)
(Continued)

(52) U.S. Cl.
CPC ............ *G06T 7/001* (2013.01); *B24B 37/013* (2013.01); *G06T 7/0006* (2013.01); *G06T 7/90* (2017.01);
(Continued)

(58) Field of Classification Search
CPC ......... G06T 7/001; G06T 7/0006; G06T 7/90; G06T 2207/10024; G06T 2207/30148;
(Continued)

(56) References Cited

U.S. PATENT DOCUMENTS 5,738,574 A 4/1998 Tolles et al.
5,823,853 A 10/1998 Bartels et al.
(Continued)

FOREIGN PATENT DOCUMENTS

JP S62-042006 2/1987
JP S63-221209 9/1988
(Continued)

OTHER PUBLICATIONS

International Search Report and Written Opinion in International Appln. No. PCT/US2017/048605, dated Dec. 5, 2017, 7 pages.
(Continued)

*Primary Examiner* — Qian Yang
(74) *Attorney, Agent, or Firm* — Fish & Richardson P.C.

(57) ABSTRACT

A metrology system for obtaining a measurement representative of a thickness of a layer on a substrate includes a camera positioned to capture a color image of at least a portion of the substrate. A controller is configured to receive the color image from the camera, store a predetermined path in a coordinate space of at least two dimension including a first color channel and a second color channel, store a function that provides a value representative of a thickness as a function of a position on the predetermined path, determine a coordinate of a pixel in the coordinate space from color data in the color image for the pixel, determine
(Continued)

a position of a point on the predetermined path that is closest to the coordinate of the pixel, and calculate a value representative of a thickness from the function and the position of the point on the predetermined path.

18 Claims, 6 Drawing Sheets

Related U.S. Application Data division of application No. 16/435,291, filed on Jun. 7, 2019, now Pat. No. 11,017,524, which is a continuation of application No. 15/686,785, filed on Aug. 25, 2017, now Pat. No. 10,325,364.

(60) Provisional application No. 62/379,920, filed on Aug. 26, 2016.

(51) Int. Cl.
  *G06T 7/90* (2017.01)
  *H01L 21/67* (2006.01)
  *H01L 21/677* (2006.01)
  *H04N 23/12* (2023.01)
  *H04N 23/56* (2023.01)

(52) U.S. Cl.
  CPC .......... *H01L 21/67253* (2013.01); *G06T 2207/10024* (2013.01); *G06T 2207/30148* (2013.01); *H01L 21/67742* (2013.01); *H04N 23/12* (2023.01); *H04N 23/56* (2023.01)

(58) Field of Classification Search
  CPC ............ B24B 37/013; H01L 21/67253; H01L 21/67742; H01L 22/12; H01L 22/24; H01L 22/30; H04N 5/2256; H04N 9/07
  See application file for complete search history.

(56) References Cited

U.S. PATENT DOCUMENTS

| | | | |
|---|---|---|---|
| 5,911,003 A | 6/1999 | Sones | |
| 6,004,187 A | 12/1999 | Nyui et al. | |
| 6,071,177 A | 6/2000 | Lin et al. | |
| 6,106,662 A | 8/2000 | Bibby et al. | |
| 6,111,634 A | 8/2000 | Pecen et al. | |
| 6,142,855 A | 11/2000 | Nyui et al. | |
| 6,190,234 B1 | 2/2001 | Swedek et al. | |
| 6,191,864 B1 | 2/2001 | Sandhu | |
| 6,290,572 B1 | 9/2001 | Hofmann | |
| 6,358,362 B1 | 3/2002 | En et al. | |
| 6,361,646 B1 | 3/2002 | Bibby et al. | |
| 6,466,642 B1 | 10/2002 | Meloni | |
| 6,511,363 B2 | 1/2003 | Yamane et al. | |
| 6,517,413 B1 | 2/2003 | Hu et al. | |
| 6,618,130 B2 | 9/2003 | Chen | |
| 6,630,681 B1 | 10/2003 | Kojima | |
| 6,930,782 B1 | 8/2005 | Yi et al. | |
| 7,008,295 B2 | 3/2006 | Wiswesser et al. | |
| 7,018,271 B2 | 3/2006 | Wiswesser et al. | |
| 7,300,332 B2 | 11/2007 | Kobayashi et al. | |
| 7,406,394 B2 | 7/2008 | Swedek et al. | |
| 7,438,627 B2 | 10/2008 | Kobayashi et al. | |
| 7,645,181 B2 | 1/2010 | Kobayashi et al. | |
| 7,840,375 B2 | 11/2010 | Ravid et al. | |
| 8,045,142 B2 | 10/2011 | Kimba | |
| 8,088,298 B2 | 1/2012 | Swedek et al. | |
| 8,157,616 B2 | 4/2012 | Shimizu et al. | |
| 8,292,693 B2 | 10/2012 | David et al. | |
| 8,657,646 B2 | 2/2014 | Benvegnu et al. | |
| 8,814,631 B2 | 8/2014 | David et al. | |
| 9,095,952 B2 | 8/2015 | Benvegnu et al. | |
| 9,822,460 B2 | 11/2017 | Dineen et al. | |
| 10,563,973 B2 | 2/2020 | Li et al. | |
| 11,682,114 B2 | 8/2023 | Benvegnu | |
| 2002/0016066 A1 | 2/2002 | Birang et al. | |
| 2002/0055192 A1 | 5/2002 | Redeker et al. | |
| 2002/0159626 A1 | 10/2002 | Shiomi et al. | |
| 2003/0182051 A1 | 9/2003 | Yamamoto | |
| 2003/0184742 A1 | 10/2003 | Stanke et al. | |
| 2003/0207651 A1 | 11/2003 | Kim et al. | |
| 2004/0012795 A1 | 1/2004 | Moore | |
| 2004/0058543 A1 | 3/2004 | Bothra | |
| 2004/0080757 A1 | 4/2004 | Stanke et al. | |
| 2004/0259472 A1 | 12/2004 | Chalmers et al. | |
| 2005/0013481 A1 | 1/2005 | Toba | |
| 2005/0026542 A1 | 2/2005 | Battal et al. | |
| 2005/0042975 A1 | 2/2005 | David | |
| 2005/0213793 A1 | 9/2005 | Oya et al. | |
| 2006/0017855 A1 | 1/2006 | Yamada | |
| 2006/0020419 A1 | 1/2006 | Benvegnu | |
| 2006/0061746 A1 | 3/2006 | Kok et al. | |
| 2006/0166608 A1 | 7/2006 | Chalmers et al. | |
| 2007/0042675 A1 | 2/2007 | Benvegnu et al. | |
| 2007/0077671 A1 | 4/2007 | David et al. | |
| 2008/0013822 A1 | 1/2008 | Pai et al. | |
| 2008/0099443 A1 | 5/2008 | Benvegnu et al. | |
| 2008/0117226 A1 | 5/2008 | Edge et al. | |
| 2008/0249728 A1 | 10/2008 | Michelsson et al. | |
| 2009/0014409 A1 | 1/2009 | Grimbergen | |
| 2009/0014764 A1 | 1/2009 | Coudrain et al. | |
| 2009/0136117 A1 | 5/2009 | Barkol et al. | |
| 2009/0153352 A1 | 6/2009 | Julio | |
| 2009/0153859 A1 | 6/2009 | Kimba | |
| 2009/0298387 A1 | 12/2009 | Shimizu et al. | |
| 2010/0015889 A1 | 1/2010 | Shimizu et al. | |
| 2010/0093260 A1 | 4/2010 | Kobayashi et al. | |
| 2010/0124870 A1 | 5/2010 | Benvegnu et al. | |
| 2011/0104987 A1 | 5/2011 | David et al. | |
| 2011/0194752 A1 | 8/2011 | Pang | |
| 2011/0275281 A1 | 11/2011 | David et al. | |
| 2011/0318992 A1 | 12/2011 | David et al. | |
| 2012/0019830 A1 | 1/2012 | Kimba | |
| 2012/0021672 A1 | 1/2012 | David et al. | |
| 2012/0026492 A1 | 2/2012 | Zhang et al. | |
| 2012/0034844 A1 | 2/2012 | Zhang et al. | |
| 2012/0129277 A1 | 5/2012 | Lahiri et al. | |
| 2012/0289124 A1 | 11/2012 | Benvegnu et al. | |
| 2013/0052916 A1 | 2/2013 | David et al. | |
| 2013/0149938 A1 | 6/2013 | Kobayashi et al. | |
| 2013/0236085 A1 | 9/2013 | Chen et al. | |
| 2013/0280989 A1 | 10/2013 | Lee et al. | |
| 2013/0288571 A1 | 10/2013 | David et al. | |
| 2013/0342741 A1 | 12/2013 | Liu et al. | |
| 2013/0344625 A1 | 12/2013 | Benvegnu et al. | |
| 2014/0011429 A1 | 1/2014 | David et al. | |
| 2014/0148008 A1 | 5/2014 | Wu | |
| 2014/0206259 A1 | 7/2014 | Benvegnu et al. | |
| 2014/0375988 A1 | 12/2014 | Ito et al. | |
| 2015/0017745 A1 | 1/2015 | Kimba et al. | |
| 2016/0121451 A1 | 5/2016 | Moore | |
| 2016/0379344 A1* | 12/2016 | Kokemohr | ............... G06T 7/13 382/164 |
| 2017/0140525 A1 | 5/2017 | Benvegnu et al. | |
| 2017/0213496 A1 | 7/2017 | Hsu | |
| 2018/0061032 A1 | 3/2018 | Benvegnu | |
| 2019/0295239 A1 | 9/2019 | Benvegnu | |
| 2021/0248730 A1 | 8/2021 | Benvegnu | |

FOREIGN PATENT DOCUMENTS

| | | |
|---|---|---|
| JP | H11-207614 | 8/1999 |
| JP | 2001-345299 | 12/2001 |
| JP | 2002-359217 | 12/2002 |
| JP | 2003-346285 | 12/2003 |
| JP | 2004-279297 | 10/2004 |
| JP | 2006-120133 | 5/2006 |
| JP | 2006-138768 | 6/2006 |
| JP | 2010-021417 | 1/2010 |
| JP | 2010-093147 | 4/2010 |
| JP | 2013-211010 | 10/2013 |
| KR | 20150010392 | 1/2015 |

(56) References Cited

FOREIGN PATENT DOCUMENTS

| | | |
|---|---|---|
| TW | 200404643 | 4/2004 |
| TW | 200407528 | 5/2004 |
| TW | 200512476 | 4/2005 |
| TW | 201213050 | 4/2012 |
| TW | 201249598 | 12/2012 |
| TW | 201538804 | 10/2015 |
| TW | 201620676 | 6/2016 |
| WO | WO 2011/094706 | 8/2011 |
| WO | WO 2012/148716 | 11/2012 |
| WO | WO 2013/118543 | 5/2015 |

OTHER PUBLICATIONS

Machine translation for Japan Patent Application Publication 2004-279297, IDS (Year: 2004).
Office Action in Japanese Appln. No. 2019-511393, dated Sep. 7, 2021, 12 pages (with English translation).
Office Action in Japanese Appln. No. 2022-093649, dated Jun. 6, 2023, 7 pages (with English translation).
Office Action in Korean Appln. No. 10-2019-7008735, dated Apr. 29, 2022, 7 pages (with English translation only).
Office Action in Taiwanese Appln. No. 110134807, dated May 13, 2022, 6 pages (with English search report).
Office Action in Japanese Appln. No. 2022-093649, dated Jan. 16, 2024, 6 pages (with English translation).

* cited by examiner

THICKNESS MEASUREMENT OF SUBSTRATE USING COLOR METROLOGY

CROSS-REFERENCE TO RELATED APPLICATIONS

This application is a continuation of U.S. patent application Ser. No. 17/242,158, filed Apr. 27, 2021, which is a divisional of U.S. patent application Ser. No. 16/435,291, filed Jun. 7, 2019, which is a continuation of U.S. patent application Ser. No. 15/686,785, filed Aug. 25, 2017, which claims priority to U.S. Provisional Application Ser. No. 62/379,920, filed Aug. 26, 2016, the disclosures of which are incorporated by reference.

TECHNICAL FIELD

This disclosure relates to optical metrology, e.g., to detect the thickness of a layer on a substrate.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, determining the polishing endpoint merely as a function of polishing time can lead to overpolishing or underpolishing of the substrate.

Various optical metrology systems, e.g., spectrographic or ellipsometric, can be used to measure the thickness of the substrate layer pre-polishing and post-polishing, e.g., at an in-line or stand-along metrology station. In addition, various in-situ monitoring techniques, such as monochromatic optical or eddy current monitoring, can be used to detect a polishing endpoint.

SUMMARY

In one aspect, a metrology system for obtaining a measurement representative of a thickness of a layer on a substrate includes a support to hold a substrate for integrated circuit fabrication, a color camera positioned to capture a color image of at least a portion of the substrate held by the support, and a controller. The controller is configured to receive the color image from the camera, store a predetermined path in a coordinate space of at least two dimension including a first color channel and a second color channel, store a function that provides a value representative of a thickness as a function of a position on the predetermined path, for a pixel of the color image determine a coordinate of the pixel in the coordinate space from color data in the color image for the pixel, determine a position of a point on the predetermined path that is closest to the coordinate of the pixel, and calculate a value representative of a thickness from the function and the position of the point on the predetermined path.

Another aspect is a computer program product including instructions for causing a processor for obtaining a measurement representative of a thickness of a layer on a substrate. Another aspect is a method of obtaining a measurement representative of a thickness of a layer on a substrate.

Implementations of any aspect include one or more of the following features.

The coordinate space may be two-dimensional or three-dimensional.

The first color channel and the selected color channel may selected from the group of color channels comprising hue, saturation, luminosity, X, Y, Z, red chromaticity, green chromaticity, and blue chromaticity. For example, the first color channel may be a red chromaticity and the second color channel may be a green chromaticity.

The controller may be configured to determine the position of the point on the predetermined path by determining a point on the path at which a normal vector to the thickness path passes through the coordinate. The controller may be configured to resolve a degeneracy in the predetermined path by analyzing a cluster of coordinates associated with pixels from a given physical region on the substrate surrounding the pixel. The controller may be configured to resolve the degeneracy in the predetermined path by determining a major axis of the cluster in the coordinate space and select a branch of the predetermine path that is most closely parallel to the major axis.

The function may include an interpolation between a first value for a first vertex of the predetermined path and a second value for a second vertex of the predetermined path based on a distance of the point from the first vertex. The first vertex is a starting point of the predetermined path and the second vertex is an end point of the predetermined path. The controller may be configured to store the predetermined path by storing one or more of a Bezier function or a polyline.

The controller may be configured to, for each of a plurality of pixels of the color image, determine a coordinate of the pixel in the coordinate space from color data in the color image for the pixel, determine the position of the point on the predetermined path that is closest to the coordinate of the pixel, and calculate the value representative of the thickness from the function and the position of the point on the predetermined path, to provide a plurality of values representative of thickness for a plurality of different positions on the substrate. The controller may be configured to count a number of pixels from the plurality of pixels in which the value representative of the thickness fails to meet a threshold. The controller may be configured to apply an image mask to the color image.

The color camera may be configured to capture an image of less than all of the substrate and is configured to scan across the substrate, and wherein the controller is configured to generate a 2-dimensional color image of all of the substrate from multiple images from the color camera. The color camera may be a color line-scan camera having detector elements arranged along a first axis that is parallel to the surface of the substrate during scanning of the substrate, and the system may include an elongated white light source having a longitudinal axis parallel to the first axis and configured to direct light toward the substrate at a non-zero incidence angle during scanning of the substrate, a frame supporting the light source and the camera, and a motor to cause relative motion between the frame and the support along a second axis perpendicular to the first axis to cause the light source and the camera to scan across the substrate.

The support may be positioned in an in-line metrology station of a semiconductor fabrication tool. The semiconductor fabrication tool may be a chemical mechanical polisher, and the tool may include a robot to transfer the substrate into the in-line metrology station, and the controller may be configured to cause the substrate to be measured by before or after polishing of a surface of the substrate by the chemical mechanical polisher.

Implementations can include one or more of the following potential advantages. Thickness of a location on a substrate layer can be determined, either absolutely or relative to other portions of the substrate layer, and unacceptable variations can be detected. This information can be used in a feed-forward or feed-back use to control polishing parameters, providing improved thickness uniformity. The algorithm to determine variations can be simple and have low computational load.

The details of one or more implementations are set forth in the accompanying drawings and the description below. Other aspects, features and advantages will be apparent from the description and drawings, and from the claims.

DESCRIPTION OF DRAWINGS

Like reference symbols in the various drawings indicate like elements.

DETAILED DESCRIPTION

The thickness of a layer on a substrate can be optically measured before or after polishing, e.g., at an in-line or stand-alone metrology station. However, some optical techniques such as spectrometry require expensive spectrographs and computationally heavy manipulation of spectra data. Even apart from computational load, in some situations the algorithm results do not meet the ever increasing accuracy requirements of the user. However, another metrology technique is to take a color image of the substrate, and analyze the image in a color space to determine the thickness of the layer. In particular, the position along a path in a 2-dimensional color space can provide information on the current state of polishing, e.g., amount removed or amount of material remaining.

Figure 1:
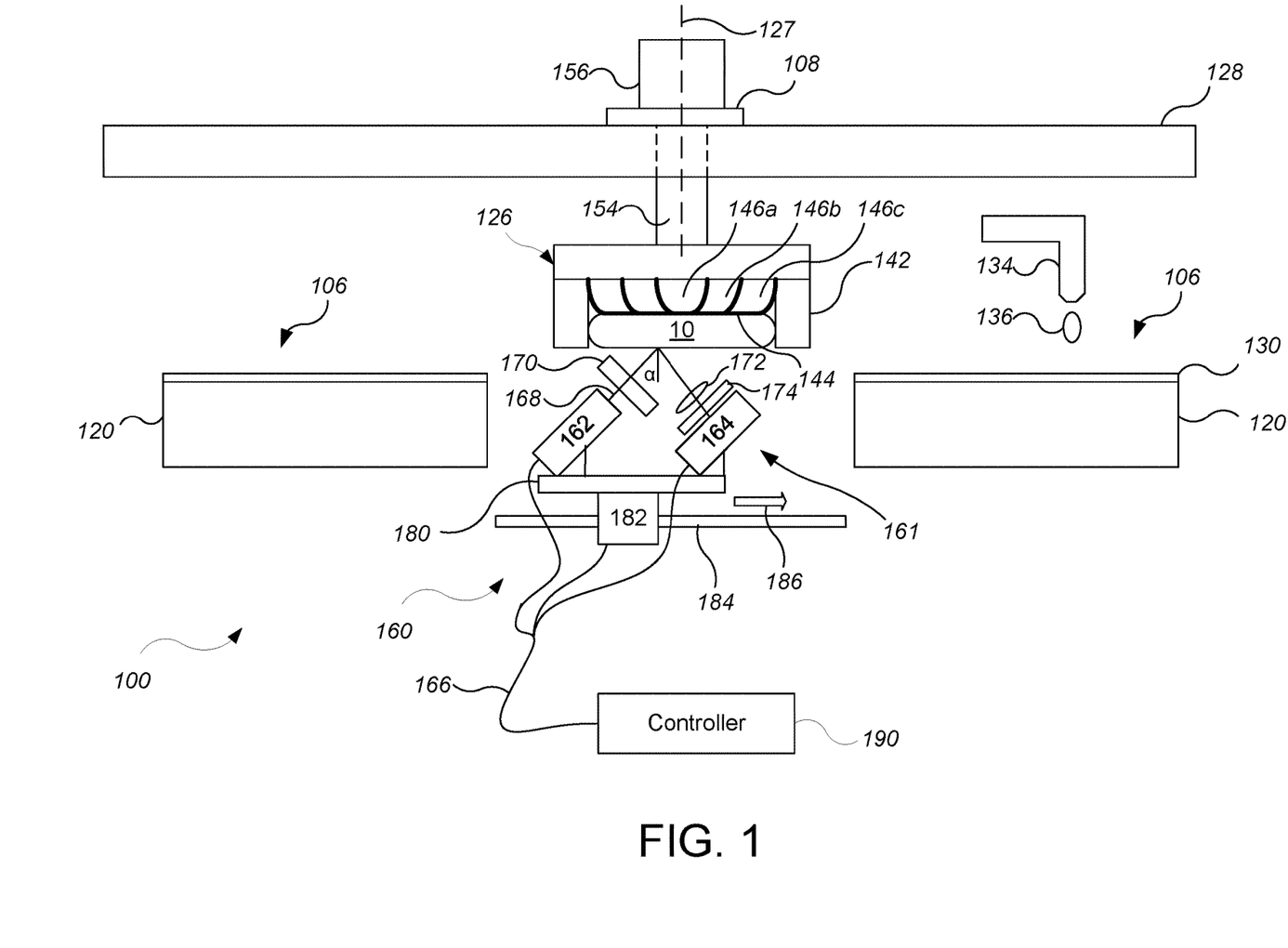
FIG. 1 illustrates a schematic view of an example of an in-line optical measurement system.

Referring to FIG. 1, a polishing apparatus 100 includes an in-line (also referred to as in-sequence) optical metrology system 160, e.g., a color imaging system.

The polishing apparatus 100 includes one or more carrier heads 126, each of which is configured to carry a substrate 10, one or more polishing stations 106, and a transfer station to load substrate to and unload substrates from a carrier head. Each polishing station 106 includes a polishing pad 130 supported on a platen 120. The polishing pad 110 can be a two-layer polishing pad with an outer polishing layer and a softer backing layer.

The carrier heads 126 can be suspended from a support 128, and movable between the polishing stations. In some implementations, the support 128 is an overhead track and the carrier heads 126 are coupled to a carriage 108 that is mounted to the track. The overhead track 128 allows each carriage 108 to be selectively positioned over the polishing stations 124 and the transfer station. Alternatively, in some implementations the support 128 is a rotatable carousel, and rotation of the carousel moves the carrier heads 126 simultaneously along a circular path.

Each polishing station 106 of the polishing apparatus 100 can include a port, e.g., at the end of an arm 134, to dispense polishing liquid 136, such as abrasive slurry, onto the polishing pad 130. Each polishing station 106 of the polishing apparatus 100 can also include pad conditioning apparatus to abrade the polishing pad 130 to maintain the polishing pad 130 in a consistent abrasive state.

Each carrier head 126 is operable to hold a substrate 10 against the polishing pad 130. Each carrier head 126 can have independent control of the polishing parameters, for example pressure, associated with each respective substrate. In particular, each carrier head 126 can include a retaining ring 142 to retain the substrate 10 below a flexible membrane 144. Each carrier head 126 also includes a plurality of independently controllable pressurizable chambers defined by the membrane, e.g., three chambers 146a-146c, which can apply independently controllable pressurizes to associated zones on the flexible membrane 144 and thus on the substrate 10. Although only three chambers are illustrated in FIG. 1 for ease of illustration, there could be one or two chambers, or four or more chambers, e.g., five chambers.

Each carrier head 126 is suspended from the support 128, and is connected by a drive shaft 154 to a carrier head rotation motor 156 so that the carrier head can rotate about an axis 127. Optionally each carrier head 140 can oscillate laterally, e.g., by driving the carriage 108 on the track 128, or by rotational oscillation of the carousel itself. In operation, the platen is rotated about its central axis 121, and each carrier head is rotated about its central axis 127 and translated laterally across the top surface of the polishing pad. The lateral sweep is in a direction parallel to the polishing surface 212. The lateral sweep can be a linear or arcuate motion.

A controller 190, such as a programmable computer, is connected to each motor to independently control the rotation rate of the platen 120 and the carrier heads 126. For example, each motor can include an encoder that measures the angular position or rotation rate of the associated drive shaft. Similarly, the controller 190 is connected to an actuator in each carriage 108 and/or the rotational motor for the carousel to independently control the lateral motion of each carrier head 126. For example, each actuator can include a linear encoder that measures the position of the carriage 108 along the track 128.

The controller 190 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories.

The in-line optical metrology system 160 is positioned within the polishing apparatus 100, but does not perform measurements during the polishing operation; rather measurements are collected between polishing operations, e.g., while the substrate is being moved from one polishing station to another or from or to the transfer station.

The in-line optical metrology system 160 includes a sensor assembly 161 supported at a position between two of the polishing stations 106, e.g., between two platens 120. In particular, the sensor assembly 161 is located at a position such that a carrier head 126 supported by the support 128 can position the substrate 10 over the sensor assembly 161.

In implementations in which the polishing apparatus 100 include three polishing stations and carries the substrates sequentially from the first polishing station to the second polishing station to the third polishing station, one or more sensor assemblies 161 can be positioned between the transfer station and the first polishing station, between first and second polishing stations, between the second and third polishing stations, and/or between the third polishing station and the transfer station.

The sensor assembly 161 can include a light source 162, a light detector 164, and circuitry 166 for sending and receiving signals between the controller 190 and the light source 162 and light detector 164.

The light source 162 can be operable to emit white light. In one implementation, the white light emitted includes light having wavelengths of 200-800 nanometers. A suitable light source is an array of white-light light emitting diodes (LEDs), or a xenon lamp or a xenon mercury lamp. The light source 162 is oriented to direct light 168 onto the exposed surface of the substrate 10 at a non-zero angle of incidence α. The angle of incidence α can be, for example, about 30° to 75°, e.g., 50°.

The light source can illuminate a substantially linear elongated region that spans the width of the substrate 10. For the light source can 162 can include optics, e.g., a beam expander, to spread the light from the light source into an elongated region. Alternatively or in addition, the light source 162 can include a linear array of light sources. The light source 162 itself, and the region illuminated on the substrate, can elongated and have a longitudinal axis parallel to the surface of the substrate.

A diffuser 170 can be placed in the path of the light 168, or the light source 162 can include a diffuser, to diffuse the light before it reaches the substrate 10.

The detector 164 is a color camera that is sensitive to light from the light source 162. The camera includes an array of detector elements. For example, the camera can include a CCD array. In some implementations, the array is a single row of detector elements. For example, the camera can be a linescan camera. The row of detector elements can extend parallel to the longitudinal axis of the elongated region illuminated by the light source 162. Where the light source 162 includes a row of light emitting elements, the row of detector elements can extend along a first axis parallel to the longitudinal axis of the light source 162. A row of detector elements can include 1024 or more elements.

The camera 164 is configured with appropriate focusing optics 172 to project a field of view of the substrate onto the array of detector elements 178. The field of view can be long enough to view the entire width of the substrate 10, e.g., 150 to 300 mm long. The camera 164, including associated optics 172, can be configured such that individual pixels correspond to a region having a length equal to or less than about 0.5 mm. For example, assuming that the field of view is about 200 mm long and the detector 164 includes 1024 elements, then an image generated by the linescan camera can have pixels with a length of about 0.5 mm. To determine the length resolution of the image, the length of the field of view (FOV) can be divided by the number of pixels onto which the FOV is imaged to arrive at a length resolution.

The camera 164 can be also be configured such that the pixel width is comparable to the pixel length. For example, an advantage of a linescan camera is its very fast frame rate. The frame rate can be at least 5 kHz. The frame rate can be set at a frequency such that as the imaged area scans across the substrate 10, the pixel width is comparable to the pixel length, e.g., equal to or less than about 0.3 mm.

The light source 162 and the light detector 164 can be supported on a stage 180. Where the light detector 164 is a line-scan camera, the light source 162 and camera 164 are movable relative to the substrate 10 such that the imaged area can scan across the length of the substrate. In particular, the relative motion can be in a direction parallel to the surface of the substrate 10 and perpendicular to the row of detector elements of the linescan camera 164.

In some implementations, the stage 182 is stationary, and the carrier head 126 moves, e.g., either by motion of the carriage 108 or by rotational oscillation of the carousel. In some implementations, the stage 180 is movable while the carrier head 126 remains stationary for the image acquisition. For example, the stage 180 can be movable along a rail 184 by a linear actuator 182. In either case, this permits the light source 162 and camera 164 to stay in a fixed position relative to each other as the area being scanned moves across the substrate 10.

A possible advantage of having a line-scan camera and light source that move together across the substrate is that, e.g., as compared to a conventional 2D camera, the relative angle between the light source and the camera remains constant for different positions across the wafer. Consequently, artifacts caused by variation in the viewing angle can be reduced or eliminated. In addition, a line scan camera can eliminate perspective distortion, whereas a conventional 2D camera exhibits inherent perspective distortion, which then needs to be corrected by an image transformation.

The sensor assembly 161 can include a mechanism to adjust vertical distance between the substrate 10 and the light source 162 and detector 164. For example, the sensor assembly 161 can an actuator to adjust the vertical position of the stage 180.

Optionally a polarizing filter 174 can be positioned in the path of the light, e.g., between the substrate 10 and the detector 164. The polarizing filter 184 can be a circular polarizer (CPL). A typical CPL is a combination of a linear polarizer and quarter wave plate. Proper orientation of the polarizing axis of the polarizing filter 184 can reduce haze in the image and sharpen or enhance desirable visual features.

Assuming that the outermost layer on the substrate is a semitransparent layer, e.g., a dielectric layer, the color of light detected at detector 164 depends on, e.g., the composition of the substrate surface, substrate surface smoothness, and/or the amount of interference between light reflected from different interfaces of one or more layers (e.g., dielectric layers) on the substrate.

As noted above, the light source 162 and light detector 164 can be connected to a computing device, e.g., the controller 190, operable to control their operation and receive their signals.

Figure 2:
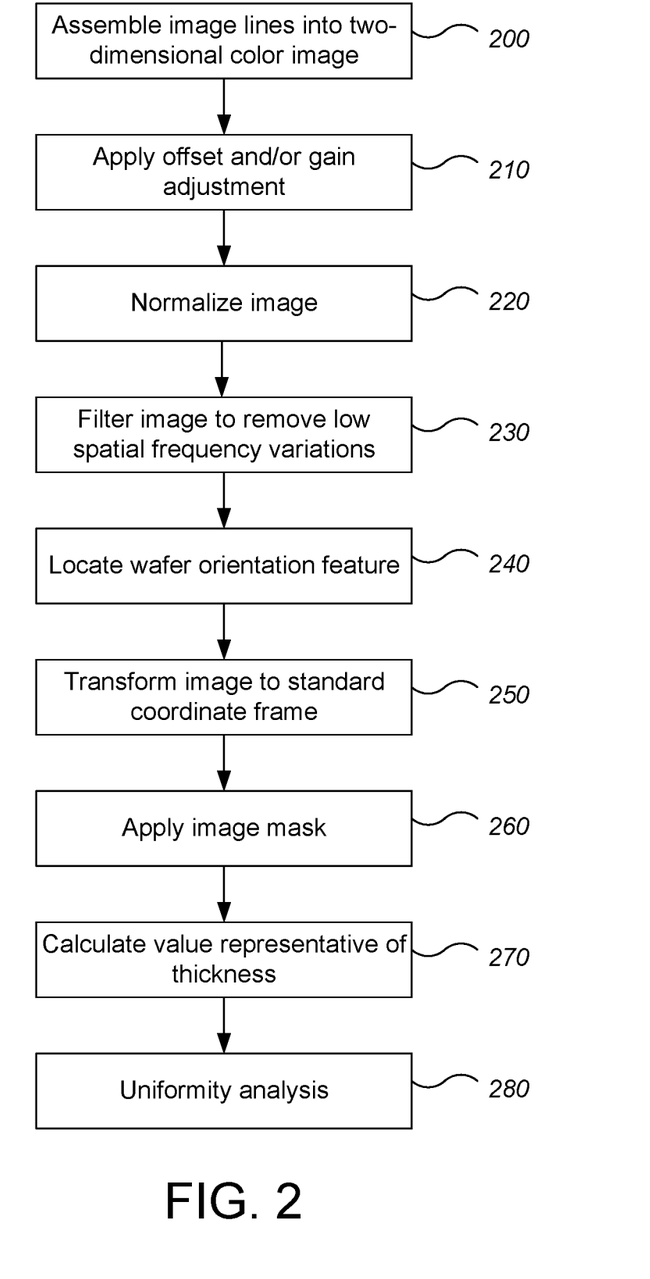
FIG. 2 is a flow chart for a method of determining layer thickness.

Referring to FIG. 2, the controller assembles the individual image lines from the light detector 164 into a two-dimensional color image (step 200). The camera 164 can include separate detector elements for each of red, blue and green. The two-dimensional color image can include a monochromatic image 204, 206, 208 for each of the red, blue and green color channels.

The controller can apply an offset and/or a gain adjustment to the intensity values of the image in each color channel (step 210). Each color channel can have a different offset and/or gain.

Optionally, the image can be normalized (step 220). For example, the difference between the measured image and a standard predefined image can be calculated. For example, the controller can store a background image for each of the red, green and blue color channels, and the background image can be subtracted from the measured image for each color channel. Alternatively, the measured image can be divided by the standard predefined image.

The image can be filtered to remove low-frequency spatial variations (step 230). In some implementations, the image is transformed from a red green blue (RGB) color space to a hue saturation luminance (HSL) color space, the filter is applied in the HSL color space, and then the image is transformed back red green blue (RGB) color space. For example, in the HSL color space, the luminance channel can filtered to remove low-frequency spatial variations, i.e., hue and saturation channels are not filtered. In some implementations, the luminance channel is used to generate the filter, which is then applied to the red, green and blue images.

In some implementations, the smoothing is performed only along the first axis. For example, the luminance values of the pixels along the direction of travel 186 can be averaged together to provide an average luminance value that is a function of just the position along the first axis. Then each row of image pixels can be divided by the corresponding portion of the average luminance value that is a function of the position along the first axis.

Figure 4:
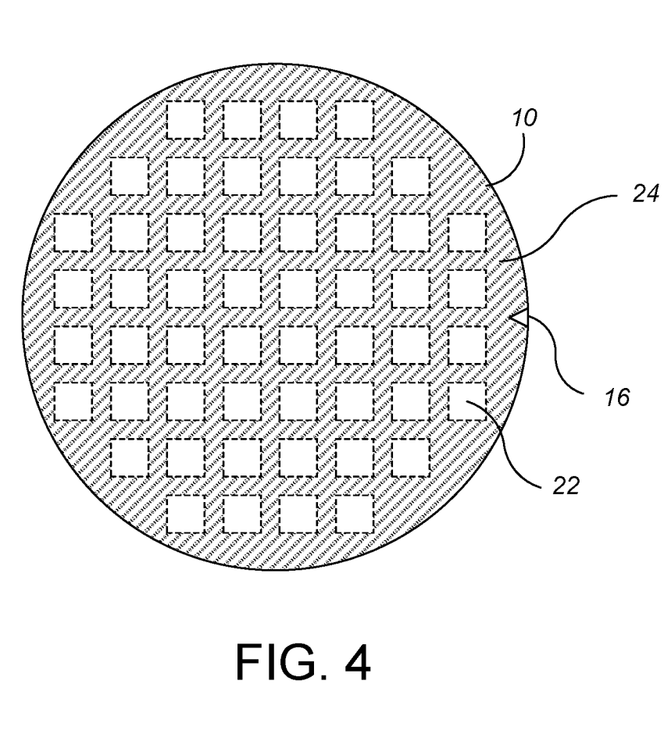
FIG. 4 is a schematic view of a mask.

The controller can use image processing techniques to analyze the image to locate a wafer orientation feature 16, e.g., a wafer notch or wafer flat, on the substrate 10 (see FIG. 4) (step 240). Image processing techniques can also be used to locate a center 18 of the substrate 10 (see FIG. 4).

Based on this data, the image is transformed, e.g., scaled and/or rotated and/or translated, into a standard image coordinate frame (step 250). For example, the image can be translated so that the wafer center is at the center point of the image and/or the image can be scaled so that the edge of the substrate is at the edge of the image, and/or the image can be rotated so that there is a Wangle between the x-axis of the image and the radial segment connecting the wafer center and the wafer orientation feature.

Figure 3:
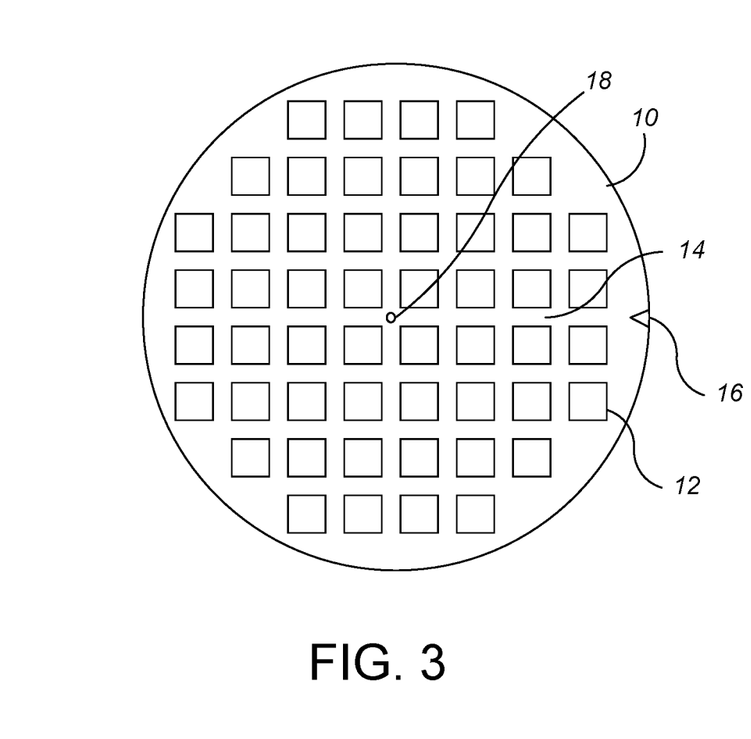
FIG. 3 is a schematic top view of a substrate.

Optionally, an image mask can applied to screen out portions of the image data (step 260). For example, referring to FIG. 3, a typical substrate 10 includes multiple dies 12. Scribe lines 14 can separate the dies 12. For some applications, it may be useful to process only image data corresponding to the dies. In this case, referring to FIG. 4, an image mask can be stored by the controller, with unmasked region 22 corresponding in spatial position to the dies 12 and masked region 24 corresponding to the scribe lines 14. Image data corresponding to the masked region 24 is not processed or not used during the thresholding step. Alternatively, the masked region 24 could correspond to the dies so that the unmasked region corresponds to the scribe lines, or the unmasked region could be only a portion of each die with a remainder of each die being masked, or the unmasked region could be specific die or dies with remaining dies and scribe lines being masked, the unmasked region could be just a portion of specific die or dies, with a remainder of each die the substrate being masked. In some implementations, the user can define the mask using a graphical user interface on the controller 190.

The color data at this stage can be used to calculate a value representative of thickness (step 270). This value could be a thickness, or an amount of material removed, or a value indicating the amount of progress through the polishing process (e.g., as compared to a reference polishing process). The calculation can be performed for each unmasked pixel in the image. This value can then be used in a feed-forward or feed-back algorithm use to control polishing parameters, providing improved thickness uniformity. For example, the value for each pixel can be compared to a target value to generate an error signal image, and this error signal image can be used for feed-forward or feed-back control.

Some background to assist in understanding of the calculation of the value representative will be discussed. For any given pixel from the color image, a pair of values corresponding to two color channels can be extracted from the color data for the given pixel. Thus, each pair of values can define a coordinate in a coordinate space of a first color channel and a different second color channel. Possible color channels include hue, saturation, luminosity, X, Y, Z (e.g., from the CIE 1931 XYZ color space), red chromaticity, green chromaticity, and blue chromaticity.

Figure 5:
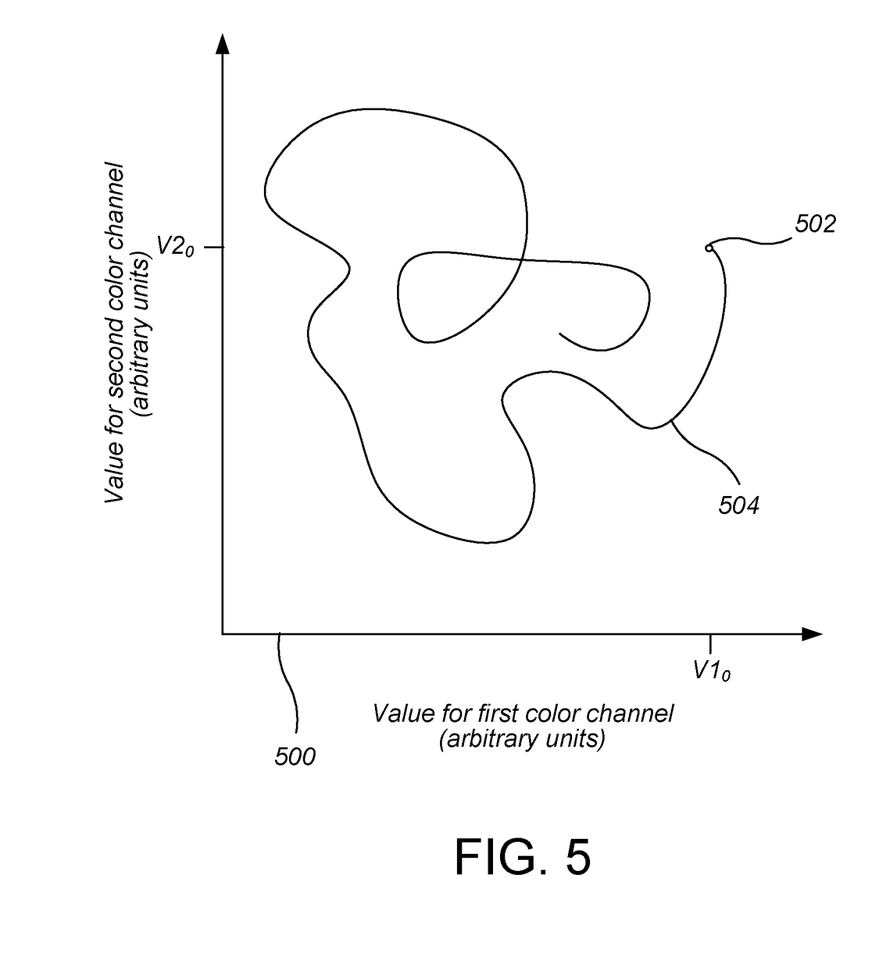
FIG. 5 illustrates an example graph showing evolution of color of light reflected from a substrate in a coordinate space of two color channels.

Referring to FIG. 5, for example, when polishing begins, the pair of values (e.g., $V1_0$, $V2_0$) defines an initial coordinate 502 in the coordinate space 500 of the two color channels. However, because the spectrum of reflected light changes as polishing progresses, the color composition of the light changes, and the values (V1, V2) in the two color channels will change. Consequently the location of the coordinate within the coordinate space of the two color channels will change as polishing progresses, tracing out a path 504 in the coordinate space 500.

Figure 6:
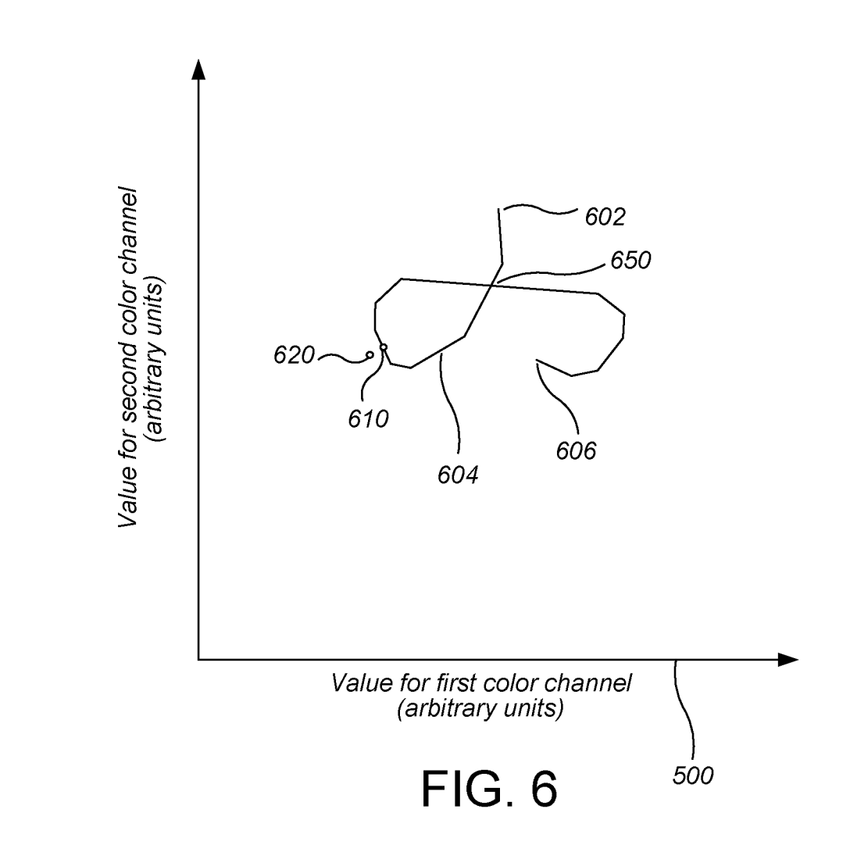
FIG. 6 illustrates an example graph showing a predetermined path in the coordinate space of two color channels.
Figure 7:
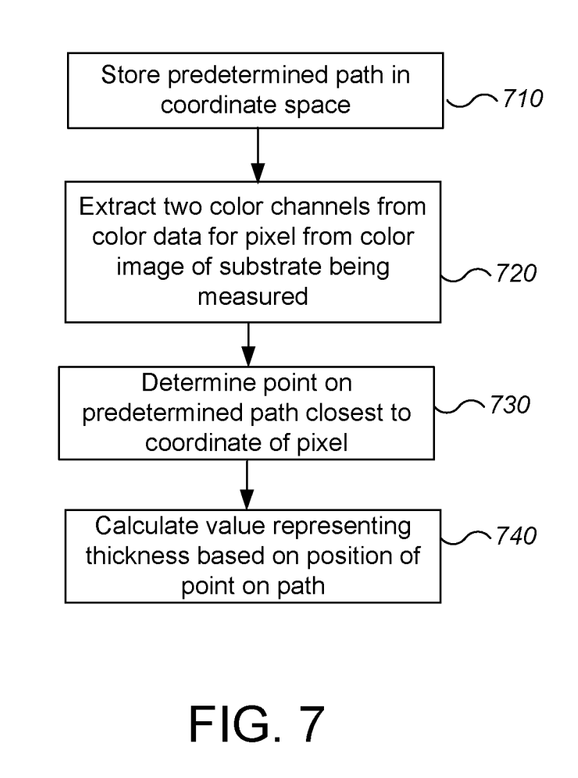
FIG. 7 is a flow chart for a method of determining layer thickness from color image data.

Referring to FIGS. 6 and 7, to calculate the value representative of thickness, a predetermined path 604 in the coordinate space 500 of the two color channels is stored (step 710), e.g., in a memory of the controller 190. The predetermined path is generated prior to measurement of the substrate. The path 404 can proceed from a starting coordinate 402 to an end coordinate 406. The path 404 can represent an entire polishing process, with the starting coordinate 402 corresponding to a starting thickness for the layer on the substrate and the end coordinate corresponding to a final thickness for the layer. Alternatively, the path can represent just a portion of a polishing process, e.g., the expected distribution of layer thicknesses across a substrate at the polishing endpoint.

In some implementations, to generate the predetermined path 404, a set-up substrate is polished to approximately the target thickness that will be used for device substrates. A color image of the set-up substrate is obtained using the optical metrology system 160. Since the polishing rate across the substrate is typically not uniform, different locations on the substrate will have different thicknesses, and thus reflect different colors, and thus have different coordinates with in the coordinate space of the first color channel and the second color channel.

Figure 8:
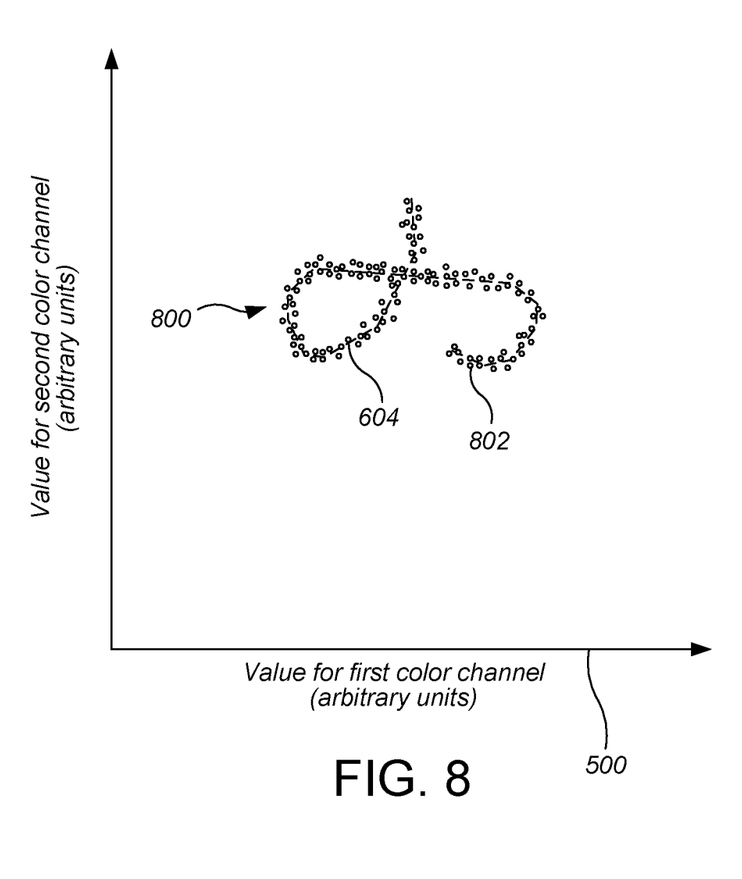
FIG. 8 illustrates an example graph showing a histogram in the coordinate space of two color channels derived from a color image of a test substrate.

Referring to FIG. 8, a two-dimensional (2D) histogram is computed using pixels contained within the unmasked regions. That is, using the color image, a scatter plot 800 is generated in the coordinate space of the first color channel and the second color channel using the coordinate values for some or all of the pixels from the unmasked portions of the set-up substrate. Each point 802 in the scatter plot is the pair of values (V1, V2) for the two color channels for a particular pixel. The scatter plot 800 can be displayed on a display of the controller 190 or another computer.

As noted above, possible color channels include hue, saturation, luminosity, X, Y, Z (e.g., from the CIE 1931 XYZ color space), red chromaticity, green chromaticity, and blue chromaticity. In some implementations, the first color channel is a red chromaticity (r) and the second color channel is a green chromaticity (g) which can be defined by $$r = \frac{R}{R+G+B} \text{ and } g = \frac{R}{R+G+B}$$

respectively, where R, G and B are the intensity values for the red, green and blue color channels of the color image.

The thickness path 604 can be created manually by a user, e.g., the operator of the semiconductor manufacturing facility, using a graphical user interface in conjunction with a computer, e.g., the controller 190. For example, while the scatter plot is being displayed, the user can manually construct a path that follows and overlies the scatter plot, e.g., using mouse operations to click on selected points of the display in the scatter plot.

Alternatively, the thickness path 604 can be generated automatically using software that is designed to analyze the set of coordinates in the scatter plot and generate a path that fits the points in the scatter plot 800, e.g., using topological skeletonization.

The thickness path 604 can be provided by a variety of functions, e.g., using a single line, a polyline, one or more circular arcs, one or more Bezier curves, and the like. In some implementations, the thickness path 604 is provided by a polyline, which is a set of line segments drawn between discrete points in the coordinate space.

Returning to FIG. 6, a function provides a relationship between positions on the predetermined thickness path 604 and thickness values. For example, the controller 190 can store a first thickness value for a starting point 602 of the predetermined thickness path 604, and a second thickness value for the ending point 606 of the predetermined thickness path 604. The first and second thickness values can be obtained by using a conventional thickness metrology system to measure the thickness of the substrate layer at the locations corresponding to the pixels that provide the points 802 closest to the starting point 602 and ending point 606, respectively.

In operation, the controller 190 can calculate a value representing the thickness at a given point 610 on the path 604 by interpolating between the first and second values based on the distance along the path 604 from the starting point 602 to the given point 610. For example, if the controller could calculate a thickness T of a given point 610 according to $$T = T1 + \frac{D}{L}(T2 - T1)$$

where T1 is the value for the starting point 602, T2 is the thickness for the ending point 606, L is the total distance along the path between the starting point 602 and the ending point 606, and D is the distance along the path between the starting point 602 and the given point 610.

As another example, the controller 190 can store a thickness value for each vertex of on the predetermined thickness path 604, and calculate a value representing thickness for a given point on the path based on interpolation between the two nearest vertices. For this configuration, the various values for the vertexes can be obtained by using a conventional thickness metrology system to measure the thickness of the substrate layer at the locations corresponding to the pixels that provide the points 802 closest to the vertexes.

Other functions relating the position on the path to thickness are possible.

In addition, rather measure the thickness of the set-up substrate using a metrology system, the thickness values could be obtained calculated based on an optical model.

The thickness values can be actual thickness value if one uses theoretical simulation or empirical learning based on a known "setup" wafer. Alternatively, the thickness value at a given point on the predetermined thickness path can be a relative value, e.g., relative to a degree of polishing of the substrate. This later value can be scaled in a downstream process to obtain an empirical value or can be used simply to express increases or decreases in thickness without specifying absolute thickness values.

Referring to FIGS. 6 and 7, for the pixel being analyzed from the image of the substrate, the values for the two color channels are extracted from the color data for that pixel (step 720). This provides a coordinate 620 in the coordinate system 600 of the two color channels.

Next, the point, e.g., point 610, on the predetermined thickness path 604 that is closest to the coordinate 620 for the pixel is calculated (step 730). In this context, "closest" does not necessarily indicate geometrical perfection. The "closest" point could be defined in various ways, and limitations of processing power, selection of search function for ease of calculation, presence of multiple local maxima in the search function, and such can prevent determination of a geometrical ideal, but still provide results that are good enough for use. In some implementations, the closest point is defined as the point on the thickness path 604 which defines the normal vector to the thickness path that passes through the coordinate 620 for the pixel. In some implementations, the closest point is calculated by minimizing a Euclidean distance.

Then the value representing thickness is calculated from the function based on the position of the point 610 on the path 604, as discussed above (step 740). The closest point is not necessarily one of the vertexes points of the polyline. As noted above, in this case, interpolation can be used to obtain the thickness value (e.g. based on simple linear interpolation between the nearest vertexes of the polyline).

By iterating steps 720-740 for some or all of the pixels in the color image, a map of the thickness of the substrate layer can be generated.

For some layer stacks on the substrate, the predetermined thickness path will cross itself, which leads to a situation referred to as a degeneracy. A degenerate point (e.g., point 650) on the predetermined thickness path has two or more thickness values associated with it. Consequently, without some additional information it may not be possible to know which thickness value is the correct value. However, it is possible to analyze the properties of a cluster of coordinates associated with pixels from a given physical region on the substrate, e.g., within a given die, and resolve the degeneracy using this additional information. For example, measurements within a given small region of the substrate can be assumed to not vary significantly, and thus would occupy a smaller section along of the scatter plot, i.e., would not extend along both branches.

As such, the controller can analyze a cluster of coordinates associated with pixels from a given physical region on the substrate surrounding the pixel for which the degeneracy needs to be resolved. In particular, the controller can determine a major axis of the cluster in the coordinate space. The branch of the predetermined thickness path that is most closely parallel to the major axis of the cluster can be selected and used to calculate the value representing thickness.

Returning to FIG. 2, optionally a uniformity analysis can be performed for each region of the substrate, e.g., each die, or for the entire image (step 280). For example, the value for each pixel can be compared to a target value, and the total number of "failing" pixels within a die, i.e., pixels that do not meet the target value, can be calculated for the die. This total can be compared to a threshold to determine whether the die is acceptable, e.g., if the total is less than the threshold then the die is marked as acceptable. This gives a pass/fail indication for each die.

As another example, the total number of "failing" pixels within the unmasked region of the substrate can be calculated. This total can be compared to a threshold to determine whether the substrate is acceptable, e.g., if the total is less than the threshold then the substrate is marked as acceptable. The threshold can be set by a user. This gives a pass/fail indication for the substrate.

Where a die or a wafer is determined to "fail", the controller 190 can generate an alert or cause the polishing system 100 to take corrective action. For example, an audible or visual alert can be generated, or a data file can be generated indicating that a particular die is not usable. As another example, a substrate could be sent back for rework.

In contrast to spectrographic processing, in which a pixel typically is represented by 1024 or more intensity values, in a color image a pixel can be represented by just three intensity values (red, green and blue), and just two color channels are needed for the calculation. Consequently, the computational load to process the color image is significantly lower.

In general, data can be used to control one or more operation parameters of the CMP apparatus. Operational parameters include, for example, platen rotational velocity, substrate rotational velocity, the polishing path of the substrate, the substrate speed across the plate, the pressure exerted on the substrate, slurry composition, slurry flow rate, and temperature at the substrate surface. Operational parameters can be controlled real-time, and can be automatically adjusted without the need for further human intervention.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

However, the color image processing technique described above can be particularly useful in the context of 3D vertical NAND (VNAND) flash memory. In particular, the layer stack used in fabrication of VNAND is so complicated that current metrology methods (e.g., Nova spectrum analysis) may be unable to perform with sufficiently reliability in detecting regions of improper thickness. In contrast, the color image processing technique can have superior throughput.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers.

Terms of relative positioning are used to denote positioning of components of the system relative to each other, not necessarily with respect to gravity; it should be understood that the polishing surface and substrate can be held in a vertical orientation or some other orientations.

A number of implementations have been described. Nevertheless, it will be understood that various modifications may be made. For example

- Rather than a line scan camera, a camera that images the entire substrate could be used. In this case, motion of the camera relative to the substrate is not needed.
- The camera could cover less than the entire width of the substrate. In this case, the camera would need to undergo motion in two perpendicular directions, e.g., be supported on an X-Y stage, in order to scan the entire substrate.
- The light source could illuminate the entire substrate. In this case, the light source need not move relative to the substrate.
- The light detector can be a spectrometer rather than a color camera; the spectra data can then be reduced to the appropriate color channels.
- Although coordinates represented by pairs of values in a 2-dimensional coordinate space are discussed above, the technique is applicable to coordinate spaces with three or more dimensions defined by three or more color channels.
- The sensory assembly need not an in-line system positioned between polishing stations or between a polishing station and a transfer station. For example, the sensor assembly could be positioned within the transfer station, positioned in a cassette interface unit, or be a stand-alone system.
- The uniformity analysis step is optional. For example, the image generated by applying the threshold transformation can be fed into a feed-forward process to adjust a later processing step for the substrate, or into a feedback process to adjust the processing step for a subsequent substrate.

Although an in-line system is described, the techniques could be applied to in-situ measurements, i.e., measurements while the substrate is being polished. In this case, various components of the monitoring system could be installed in a recess in the platen, and rotation of the platen can cause the components to scan across the substrate. For in-situ measurements, rather than construct an image, the monitoring system could simply detect the color of a white light beam reflected from a spot on the substrate, and use this color data to determine the thickness using the techniques described above.

Although the description has focused on polishing, the techniques can be applied to other sorts of semiconductor fabrication processes that add or remove layers and that can be optically monitored, such as etching and deposition.

Accordingly, other implementations are within the scope of the claims.

What is claimed is:

1. A computer program product for obtaining values representative of a plurality of thicknesses of a plurality of locations on a substrate, the computer program product tangibly embodied in a non-transitory computer readable medium, comprising instructions for causing a processor to:
receive a color image of the substrate from a color camera;
for each pixel of a plurality of pixels in the color image at a different locations in the color image
determine a coordinate of the pixel in a coordinate space of at least two dimensions including a first color channel and a second color channel from color data in the color image for the pixel; and
determine a value representative of a thickness of a layer on the substrate based on the coordinate of the pixel in the coordinate space by interpolation between a first value for a first location in the coordinate space and second value for a second location in the coordinate space; and
store a function that provides a value representative of a thickness as a function of a position on a predetermined path in the coordinate space; and
for each pixel of the plurality of pixels,
determine a position of a point on the predetermined path that is closest to the coordinate of the pixel; and
calculate the value representative of the thickness of the layer on the substrate from the function and the position of the point on the predetermined path.

2. The computer program product of claim 1, wherein the first location in the coordinate space is a first vertex of the predetermined path and the second location in the coordinate space is a second vertex of the predetermined path.

3. The computer program product of claim 1, wherein the coordinate space is two-dimensional.

4. The computer program product of claim 3, wherein the coordinate space is three-dimensional.

5. The computer program product of claim 1, wherein the first color channel and the second color channel are selected from the group of color channels comprising hue, saturation, luminosity, X, Y, Z, red chromaticity, green chromaticity, and blue chromaticity.

6. The computer program product of claim 5, wherein the first color channel is a red chromaticity and the second color channel is a green chromaticity.

7. The computer program product of claim 1, comprising instructions to locate a wafer orientation feature and a wafer center.

8. The computer program product of claim 7, comprising instructions to rotate the color image such that that there is a 0° angle between the x-axis of the color image and a radial segment connecting the wafer center and the wafer orientation feature.

9. The computer program product of claim 1, comprising instructions to receive a sequence of color images with each image capturing less than all of the substrate and to generate a 2-dimensional color image of all of the substrate from the sequence of color images.

10. A metrology system for obtaining a measurement representative of a thickness of a layer on a substrate, comprising:
a support to hold a substrate for integrated circuit fabrication;
a color camera positioned to capture a color image of at least a portion of the substrate held by the support; and
a controller configured to
receive a color image of the substrate from a color camera,
for each pixel of a plurality of pixels in the color image at a different locations in the color image,
determine a coordinate of the pixel in a coordinate space of at least two dimensions including a first color channel and a second color channel from color data in the color image for the pixel, and
determine a value representative of a thickness of a layer on the substrate based on the coordinate of the pixel in the coordinate space by interpolation between a first value for a first location in the coordinate space and second value for a second location in the coordinate space,
store a function that provides a value representative of a thickness as a function of a position on a predetermined path in the coordinate space, and
for each pixel of the plurality of pixels,
determine a position of a point on the predetermined path that is closest to the coordinate of the pixel, and
calculate the value representative of the thickness of the layer on the substrate from the function and the position of the point on the predetermined path.

11. The system claim 10, wherein the first location in the coordinate space is a first vertex of the predetermined path and the second location in the coordinate space is a second vertex of the predetermined path.

12. The system of claim 10, wherein the coordinate space is two-dimensional.

13. The system of claim 12, wherein the coordinate space is three-dimensional.

14. The system of claim 10, wherein the first color channel and the second color channel are selected from the group of color channels comprising hue, saturation, luminosity, X, Y, Z, red chromaticity, green chromaticity, and blue chromaticity.

15. The system of claim 14, wherein the first color channel is a red chromaticity and the second color channel is a green chromaticity.

16. The system of claim 10, wherein the controller is configured to locate a wafer orientation feature and a wafer center.

17. The system of claim 16, wherein the controller is configured to rotate the color image such that that there is a 0° angle between the x-axis of the color image and a radial segment connecting the wafer center and the wafer orientation feature.

18. The system of claim 10, wherein the controller is configured to receive a sequence of color images with each image capturing less than all of the substrate and to generate a 2-dimensional color image of all of the substrate from the sequence of color images.

* * * * *

UNITED STATES PATENT AND TRADEMARK OFFICE
CERTIFICATE OF CORRECTION

PATENT NO. : 12,148,148 B2
APPLICATION NO. : 18/198053
DATED : November 19, 2024
INVENTOR(S) : Dominic J. Benvegnu Page 1 of 1

It is certified that error appears in the above-identified patent and that said Letters Patent is hereby corrected as shown below:

In the Claims

In Column 14, Line 5, Claim 8, delete "that that" and insert -- that --.

In Column 14, Line 47, Claim 11, after "system" insert -- of --.

In Column 14, Line 67, Claim 17, delete "that that" and insert -- that --.

Signed and Sealed this
Twenty-fifth Day of March, 2025

Coke Morgan Stewart
*Acting Director of the United States Patent and Trademark Office*